United States Patent [19]
Kobayashi et al.

[11] Patent Number: 5,539,335
[45] Date of Patent: Jul. 23, 1996

[54] OUTPUT BUFFER CIRCUIT FOR SEMICONDUCTOR DEVICE

[75] Inventors: Isamu Kobayashi; Teruo Seki, both of Kasugai, Japan

[73] Assignee: Fujitsu Limited, Kanagawa, Japan

[21] Appl. No.: 512,913

[22] Filed: Aug. 9, 1995

[30] Foreign Application Priority Data

Aug. 17, 1994 [JP] Japan .................................. 6-193313

[51] Int. Cl.⁶ ..................................................... H03K 17/10
[52] U.S. Cl. ................................ 326/81; 326/34; 326/121
[58] Field of Search ........................... 326/21, 34, 80–81, 326/83, 86, 121

[56] References Cited

U.S. PATENT DOCUMENTS

| | | | |
|---|---|---|---|
| 4,806,795 | 2/1989 | Nakano et al. ........................... | 326/81 |
| 5,381,062 | 1/1995 | Morris .................................... | 326/21 X |
| 5,418,476 | 5/1995 | Strauss .................................... | 326/58 |
| 5,444,397 | 8/1995 | Wong et al. ............................. | 326/81 |
| 5,451,889 | 9/1995 | Heim et al. .............................. | 326/81 |
| 5,467,031 | 11/1995 | Nguyen et al. ........................... | 326/81 |
| 5,493,233 | 2/1996 | Shigehara et al. ...................... | 326/81 X |

*Primary Examiner*—David R. Hudspeth
*Attorney, Agent, or Firm*—Armstrong, Westerman, Hattori, McLeland & Naughton

[57] ABSTRACT

A output buffer circuit incorporates an output controller and voltage controller between a first and a second voltage potential to buffer the output of data produced by a semiconductor device. The output controller provides switching control signals to transistors in the voltage controller in order to prevent the first potential from being effected by the potential at the output of the output buffer.

15 Claims, 7 Drawing Sheets

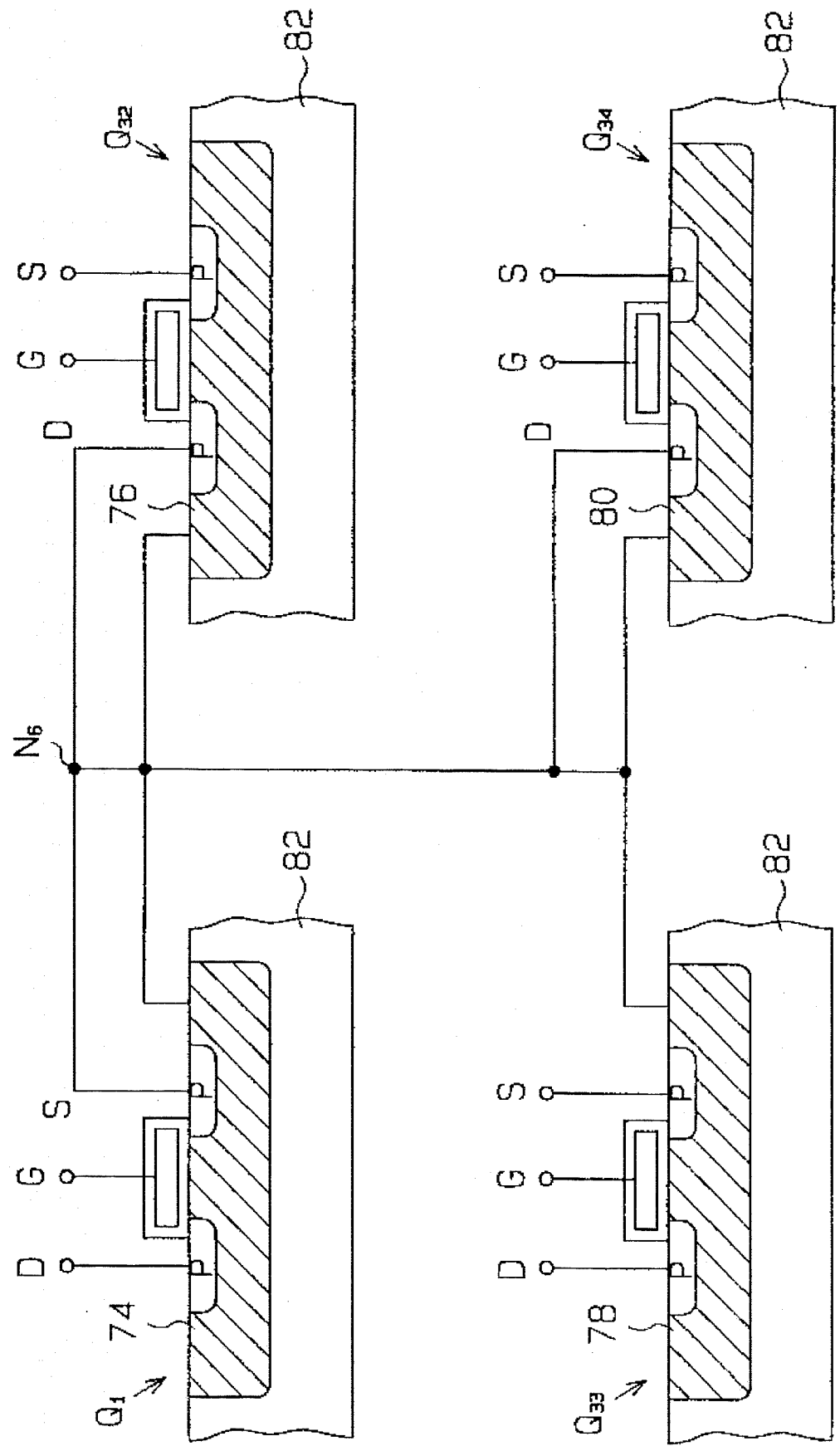

OUTPUT BUFFER CIRCUIT FOR SEMICONDUCTOR DEVICE

BACKGROUND OF THE INVENTION

Field of the Invention

The present invention relates generally to a three-state output buffer circuit for use with a semiconductor device. More particularly, this invention relates to an output buffer circuit that, when used with a semiconductor device, can operate at a drive voltage higher than its own voltage supply.

Description of the Related Art

Buffer circuits are typically used to adapt signals transferred between two or more systems. FIG. 1 is a circuit diagram of a conventional output buffer circuit connected to an internal circuit 90 of a semiconductor device (not shown). The output buffer circuit has a P channel transistor Q, and an N channel MOS transistor $Q_2$ connected in series between a high-potential power supply $V_{cc}$ (3 volts) and a low-potential power supply $V_{ss}$ (0 volts). An output terminal 108, connected to the node between both transistors $Q_1$ and $Q_2$, may be connected via a bus line (not shown) to the semiconductor device. An output controller 100 is connected to the transistors $Q_1$ and $Q_2$. The output controller 100 includes a first circuit connected to the gate of the transistor Q, and a second circuit connected to the gate of the transistor $Q_2$. The first circuit has three stages of inverters 101, 103, and 104. A NAND gate 106 is provided between the first stage inverter 101 and the second stage inverter 103. The second circuit has two inverters 102 and 105 separated by a NAND gate 107. The internal circuit 90 outputs complementary input signals IN and/IN to the inverters 102 and 101, respectively. The NAND gates 106 and 107 each have a first input terminal connected to the output terminals of the inverters 101 and 102 respectively, and each have interconnected second input terminals. The internal circuit 90 supplies an output enable signal OE to the node between the interconnected input terminals. Output enable signal OE may be provided by means of an external control unit (e.g., an external CPU).

The output controller 100 outputs a control signal to the transistors $Q_1$ and $Q_2$ in response to the high output enable signal OE and the complementary input signals IN and/IN. For example, when input signal IN is high and signal/IN is low, the controller 100 outputs a control signal low to the gates of both transistors $Q_1$ and $Q_2$. This forces transistor $Q_1$ to turn on, transistor $Q_2$ to turn off, and as a result, the output terminal 108 outputs signal Dout high to the bus line. On the other hand, when the input signal IN is low and the input signal/IN is high, the controller 100 outputs a control signal high to the gates of both transistors $Q_1$ and $Q_2$. As a result, the transistor $Q_1$ turns off, the transistor $Q_2$ turns on and the terminal 108 outputs signal Dout low to the bus line.

Given a low output of enable signal OE and complementary input signals IN and/IN, the output controller 100 outputs a first control signal high to the gate of the transistor $Q_1$ and a second control signal low to the gate of the transistor $Q_2$. When this happens, transistors $Q_1$ and $Q_2$ turn off creating a high impedance state at output terminal 108. Should the voltage of output signal on the bus line be higher (e.g. 5 volts) than the voltage needed to drive the output buffer circuit, the output terminal 108 would be set to a five volt potential. Since the source of the transistor $Q_1$ is connected to an N-type well, a high potential control signal would turn transistor $Q_2$ off. Applying 5 volts at the output terminal 108, in effect, produces a forward bias voltage (1.7 volts in this case) at what is essentially a parasitic diode. Under these conditions, current flows into the power supply $V_{cc}$ via the drain and N-type well. This degrades the stability of the power supply voltage $V_{cc}$, and consequently, the function and performance of the semiconductor device powered by voltage $V_{cc}$.

Were 3.3 volts to be applied to the transistor $Q_1$'s gate with its drain set to 5 volts, the transistor $Q_1$ would remain on despite attempts to turn it off using the 5 volts potential. Current flow would be into the power supply $V_{cc}$ via the drain and source, causing fluctuation in the constant voltage supply $V_{cc}$. While the gate oxide film of the transistor $Q_2$ is designed to be thick enough to withstand the high-potential supply voltage $V_{cc}$ or 3.3 volts, when 5 volts is applied to the drain, the voltage increase across the drain and gate permits the gate oxide film to break down.

One solution to this shortcoming is an output buffer circuit provided with a level converter 111, as shown in FIG. 2. The transistors $Q_1$ and $Q_2$ are connected in series between the power supply $V_{DD}$ (5 volts) and the power supply $V_{ss}$ (0 volts). The output controller 110 operates at the constant 3.3 volts voltage supply level $V_{cc}$, produced by an attenuator (not shown) which lowers the 5 volts supply voltage $V_{DD}$ to 3.3 volts. Voltage $V_{cc}$ is supplied to an internal circuit (not shown), NAND gates 106 and 107 and inverters 101 to 105. The level converter 111 boosts a first control signal output from the NAND gate 106 in the range of from 0 to 3.3 volts, to a 0 to 5 volt range. The level converter 111 delays the first control signal, output from the NAND gate 106, to create a second control signal for input to the transistor $Q_1$. Transistors $Q_1$ and $Q_2$ both turn on at the same time during the delay and cause current to flow from the power supply $V_{DD}$ to the power supply $V_{ss}$ via the transistors $Q_1$ and $Q_2$. This results in an overall increase in the power consumed by the output buffer circuit. A further disadvantage of using the level converter 111 is that it inhibits semiconductor device integration. Since the transistors $Q_1$ and $Q_2$ operate on the supply voltage $V_{DD}$ (5 volts), both transistors need to be designed to operate with voltages of roughly 5 volts. This makes it necessary to form the inverters 101 to 105, the NAND gates 106 and 107, and the transistors $Q_1$ and $Q_2$ in separate processes, and therefore, complicates the semiconductor fabrication process.

SUMMARY OF THE INVENTION

Accordingly, it is a primary objective of the present invention to provide an output buffer circuit for a semiconductor device, which operates without degrading the stability of the semiconductor's high potential voltage supply.

To achieve the foregoing and other objects and in accordance with the purpose of the present invention, an improved output buffer circuit is provided, which includes by reference to the following description taken in conjunction with the following figures.

FIG. 3 shows a circuit which buffers data signals output from a semiconductor device. The circuit includes a first, second and third transistor $Q_1$, $Q_2$ and $Q_3$, a well voltage controller 2 and an output controller 1. The first and second transistor $Q_1$ and $Q_2$ are connected in series between a high potential power supply $V_{cc}$ and a low potential power supply $V_{ss}$. The third transistor $Q_3$ includes a well region formed on a substrate. The transistor $Q_3$ further includes a first terminal between the first and second transistors $Q_1$ and $Q_2$, and a second terminal serving as an output terminal 3 of the output buffer circuit. Voltage potential of the output from the output buffer circuit is produced at the terminal 3. The well voltage controller 2 is coupled to the third transistor $Q_3$ to control the voltage applied to the well region of the third transistor $Q_3$. The output controller 1 is coupled to the first and second transistors $Q_1$ and $Q_2$, and generates a pair of switching control signals to control the switching of the first and second transistors $Q_1$ and $Q_2$ in response to an enable signal OE and a data signal IN from the semiconductor device. The output controller 1 also generates a voltage control signal VCS to control the voltage controller 2, such that the voltage applied to the well region of the third transistor $Q_3$ controls the flow of current across the first and second terminals of the transistor $Q_3$.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings.

FIG. 6B illustrates a N-type well configuration of an PMOS transistor according to the third embodiment;

DETAILED DESCRIPTION OF THE PREFERRED EMBODIMENTS

First Embodiment

Figure 1:
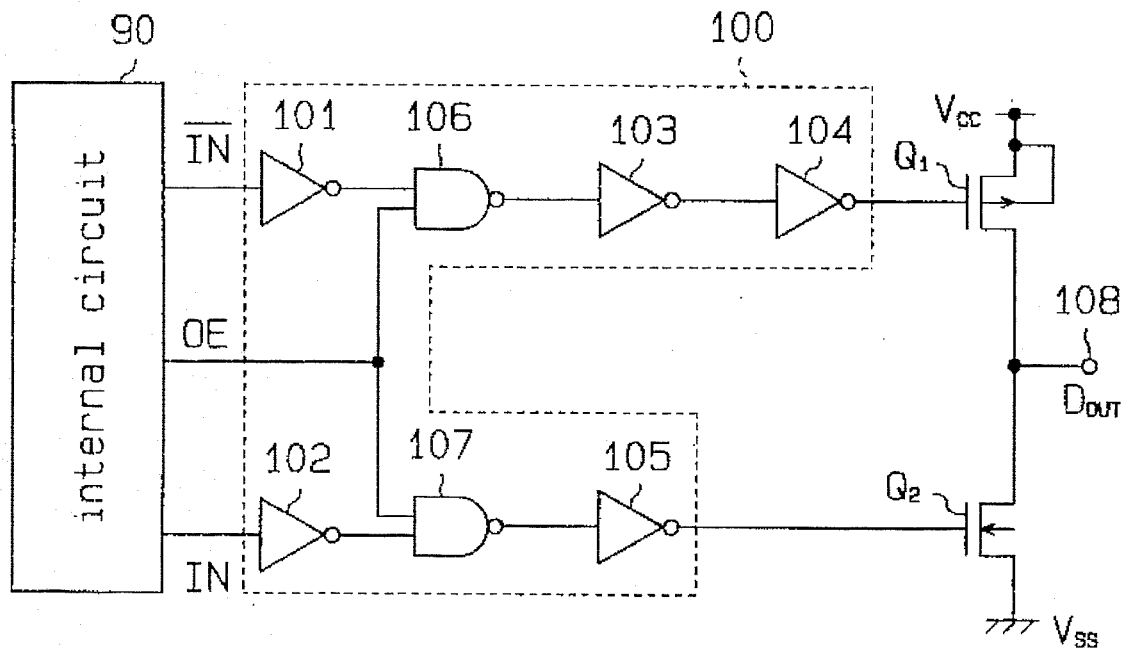
FIG. 1 is a circuit diagram showing a conventional output buffer circuit.
Figure 2:
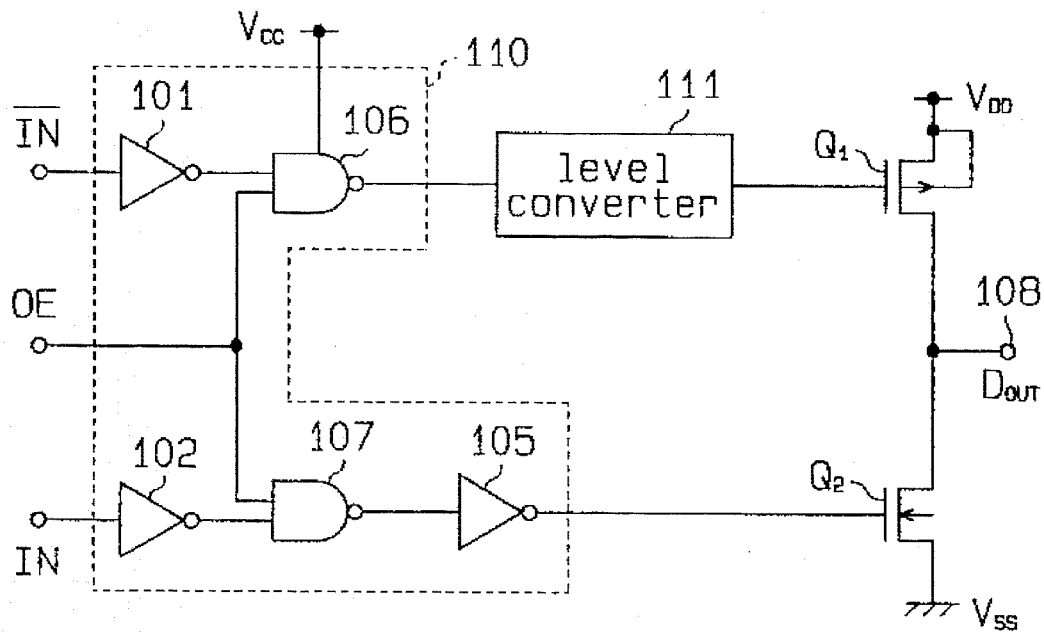
FIG. 2 is a circuit diagram showing another conventional output buffer circuit.
Figure 3:
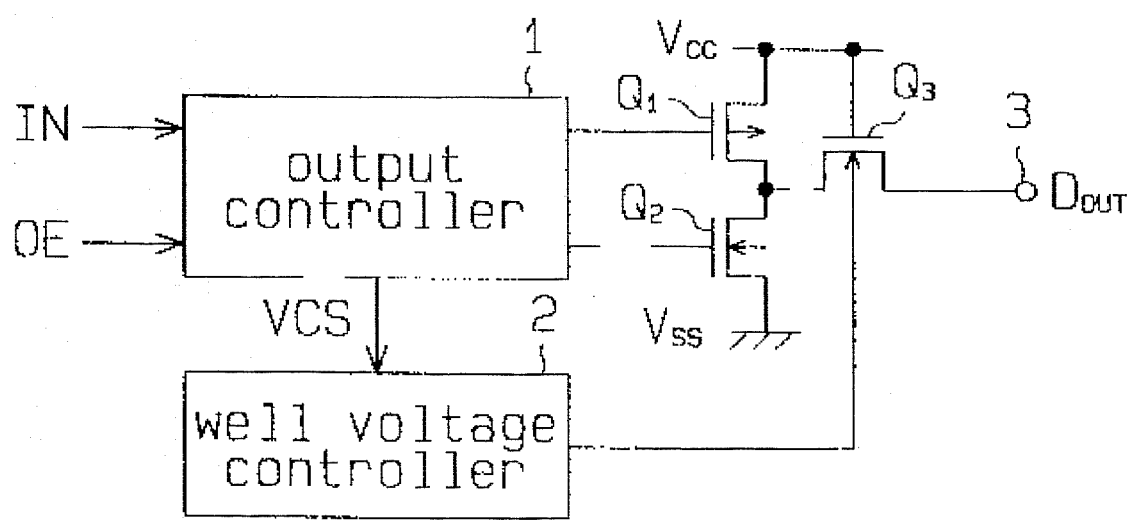
FIG. 3 is a schematic diagram showing the outline of the present invention.
Figure 4A:
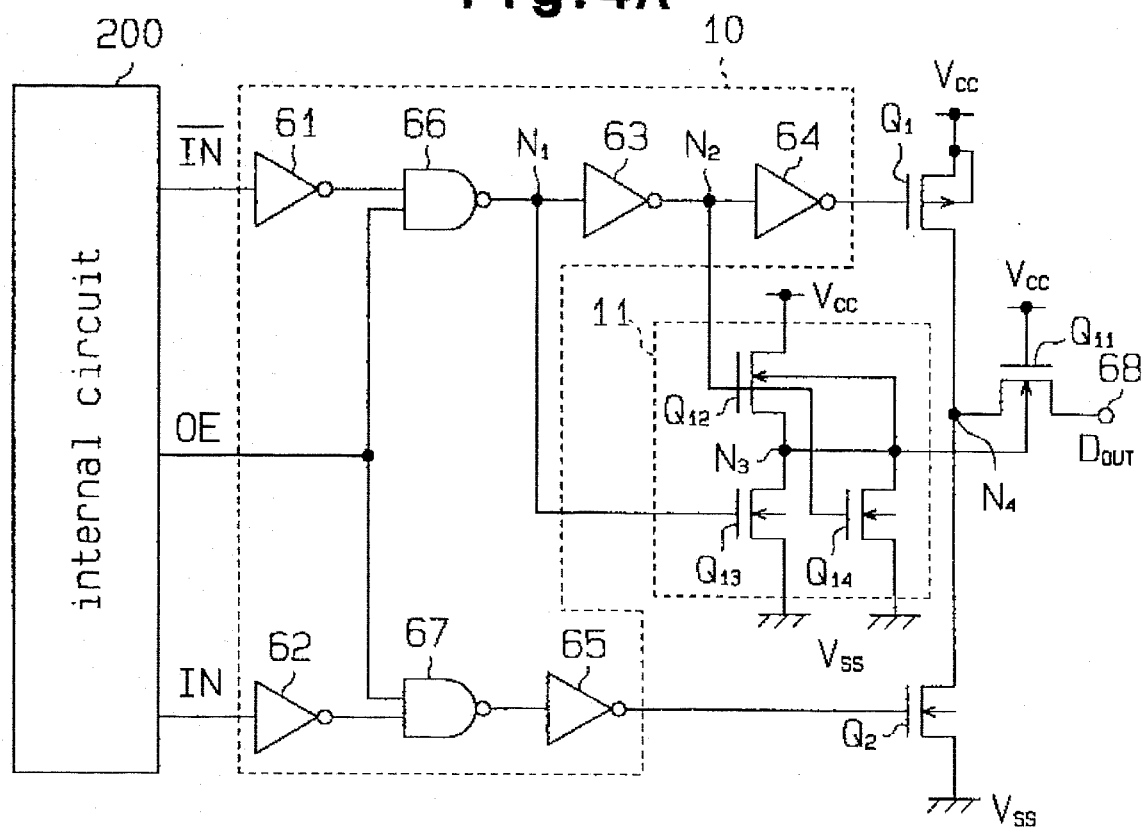
FIG. 4A is a circuit diagram showing an output buffer circuit according to a first embodiment.

An output buffer circuit according to the first embodiment of this invention will now be described with reference to FIG. 4A. This output buffer circuit, shown in FIG. 4A, is coupled to an internal circuit 200 of a semiconductor device (not shown). The output buffer circuit has a P-channel transistor $Q_1$ and an N-channel MOS transistor $Q_2$ connected in series between a high-potential power supply $V_{cc}$ (3 volts) and a low-potential power supply $V_{ss}$ (0 volts). The source of the transistor $Q_1$ is connected to the power supply $V_{cc}$, while the source of the transistor $Q_2$ is connected to the power supply $V_{ss}$. The drains of the transistors $Q_1$ and $Q_2$ are coupled together. The transistor $Q_1$ incorporates an N-type well region connected to the source. The output buffer circuit further includes an output controller 10, a well voltage controller 11 and a transfer gate $Q_{11}$, which is essentially a N-channel MOS transistor. The transfer gate $Q_{11}$ has a gate connected to the power supply $V_{cc}$, a drain connected to a node N4 between transistors $Q_1$ and $Q_2$ and a source connected to an output terminal 68. Output terminal 68 may be connected to an external semiconductor device by means of a bus line (not shown).

The output controller 10 includes a first circuit connected to the gate of the transistor $Q_1$ and a second circuit connected to the gate of the transistor $Q_2$. The first circuit has three stages of inverters 61, 63 and 64 and a NAND gate 66, between the first and second inverter stages 61 and 63. The second circuit has two stages of inverters 62 and 65 and a NAND gate 67 connected between inverters 62 and 65. The internal circuit 200 outputs complementary input signals IN and /IN to the inverters 62 and 61, respectively. The first input terminals of the NAND gates 66 and 67 are provided with output from the inverters 61 and 62, respectively, and have interconnected second input terminals. The output enable signal OE, supplied by internal circuit 200 to the node between the interconnected terminals, may be output from an external control unit such as a CPU.

Figure 4B:
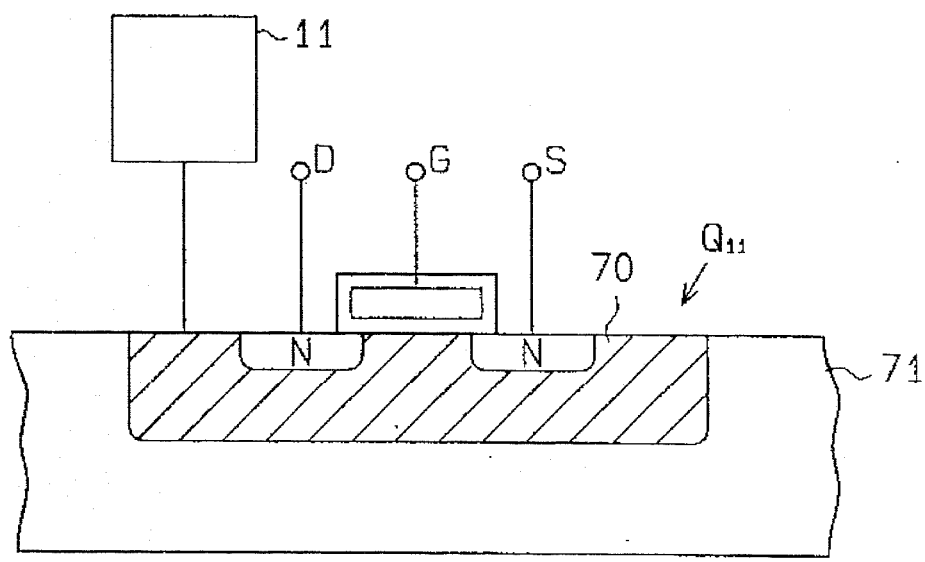
FIG. 4B illustrates a P-type well configuration of an NMOS transistor according to the first embodiment.

The well voltage controller 11 has three enhancement mode NMOS transistors $Q_{12}$, $Q_{13}$, and $Q_{14}$. The first and second transistors $Q_{12}$ and $Q_{13}$ are connected in series between the high-potential power supply $V_{cc}$ and the low-potential power supply $V_{ss}$, (0 volts). The first transistor $Q_{12}$ has a drain connected to the power supply $V_{cc}$ and a gate connected to a node N2 between the inverters 63 and 64. The second transistor $Q_{13}$ has a source connected to the power supply $V_{ss}$ and a gate connected to a node N1 between the NAND gate 66 and the inverter 63. The source of the first transistor $Q_{12}$ and the drain of the second transistor $Q_{13}$ are connected together. The third transistor $Q_{14}$ has a gate connected to the node N2 via the gate of the first transistor $Q_{12}$, a drain connected to a node N3 between the first and second transistors $Q_{12}$ and $Q_{13}$, and a source connected to the power supply $V_{ss}$. As shown in FIG. 4B, the transfer gate $Q_{11}$ have P-type well region 70 connected to the node N3 via the drain of the third transistor $Q_{14}$. The well region 70 is defined in the surface area of a substrate 71.

The operation of the output buffer circuit will now be explained based on the assumption that the internal circuit 200 outputs enable signal OE low to the output controller 10. In response to the output from inverters 61 and 62 and to enable signal OE, NAND gates 66 and 67 provide high potential output signals to the inverters 63 and 65. In turn, the inverter 63 outputs a low potential signal to the inverter 64, which outputs a high voltage level control signal to the gate of the transistor $Q_1$. In response to the signal output high from the NAND gate 67, the inverter 65 outputs a low potential control signal to the gate of the transistor $Q_2$. consequently, both transistors $Q_1$ and $Q_2$ turn off, setting the impedance at node N4 high.

When the high potential at node N1 is applied to the gate of the second transistor $Q_{13}$, and when the low potential at node N2 is applied to the gates of the first and third transistors $Q_{12}$ and $Q_{14}$, the second transistor $Q_{13}$ turns on and the first and third transistors $Q_{12}$ and $Q_{14}$ turn off. This normalizes the potential applied at node N3 as well as that at the well of the transfer gate $Q_{11}$, to that of supply voltage $V_{ss}$. As a consequence, the threshold voltage $V_{th}$ of the transfer gate $Q_{11}$ increases (e.g., in this embodiment, by about 1 volts).

Assume, for instance, that 5 volts from an external device (not shown) is supplied to the output terminal 68 set to high impedance conditions. The potential applied to the node N4 would then be 4 volts (i.e., 5 volts minus the one volt threshold voltage Vth of the transfer gate $Q_{11}$). A 3.3 volt high potential signal would appear at the gate of the transistor $Q_1$, and a 4 volt signal at its drain. Were the potential difference between the gate and drain never to exceed the threshold voltage $V_{th}$ (1 volts), the transistor $Q_1$ would stay turned off, inhibiting the flow of the current from the drain of the transistor $Q_1$ to its source. This effects an increase in the stability of the high-potential power supply $V_{cc}$ and reduces the incidence of semiconductor malfunction.

While supply voltage $V_{cc}$ (3.3 volts) is applied to the N-type well of the transistor $Q_1$, 4 volts is applied to a P-type diffusion layer, functioning as its drain. Because the P-type layer and the N-type well essentially form a parasitic diode, and because the forward bias voltage applied across the virtual PN junction is roughly 0.7 volts, current will not flow from the drain to the well. Likewise, this prevents current flow from the well of the transistor to the power supply source $V_{cc}$, and consequently, promotes $V_{cc}$ power supply stability. This allows an improved fit between the $V_{cc}$ powered output buffer and semiconductor devices powered from sources having voltages higher than $V_{cc}$.

The drain of the transistor $Q_2$ is set to 4 volts, 1 v less than the voltage applied by the external device, allowing the potential difference between the gate and drain of the transistor $Q_2$ to remain constant. This inhibits breakdown of the gate oxide film of transistor $Q_1$, which is designed to withstand a voltage of 3.3 volts. Moreover, this allows the transistor $Q_1$ to be formed by the same process used to form the inverters 61–65 and the NAND gates 66 and 67.

A description will now be given of the operation of the output buffer circuit under conditions where the internal circuit 200 outputs enable signal OE high to the output controller 10. When the input signal IN is high and the input signal/IN is low, the controller 100 outputs a low control signal to the gates of the transistors $Q_1$ and $Q_2$. This turns transistor $Q_1$ on, transistor $Q_2$ off and creates a high voltage potential at node N4. Since the potential at node N1 is low, node N2 sits at a high potential. As a result, the second transistor $Q_{13}$ turns off, the first and third transistors $Q_{12}$ and $Q_{14}$ turn on, and a high potential is applied to node N3. The same high level potential is applied to the well of the transfer gate $Q_{11}$, precipitating a decrease in the threshold voltage $V_{th}$ of the transfer gate $Q_{11}$. This allows for the smooth flow of the current through the transfer gate $Q_{11}$. In this manner, the output buffer circuit provides a high potential signal Dout from the output terminal 68 to node N4.

On the other hand, when input signal IN is low and signal/IN is high, the controller 100 outputs a high level control signal to the gates of the transistors $Q_1$ and $Q_2$. Consequently, the transistor $Q_1$ is turns off and the transistor $Q_2$ turns on, creating a low potential condition at node N4. Consequently, node N1 is set high while node N2 is set low, causing the second transistor $Q_{13}$ to turn on and the first and third transistors $Q_{12}$, and $Q_{14}$ to turn off. As a result, the low potential at node N3 is applied to the well of the transfer gate $Q_{11}$, setting the threshold voltage $V_{th}$ of the transfer gate $Q_{11}$ to roughly 1 volt. The output buffer circuit, in this manner, provides a low potential signal Dout from the output terminal 68 to node N4.

Second Embodiment

An output buffer circuit according to the second embodiment of this invention will now be described with reference to FIG. 5A. Buffer circuit components in the second embodiment corresponding or identical to those in the first embodiment will be designated with reference numerals identical to those in the first embodiment.

Figure 5A:
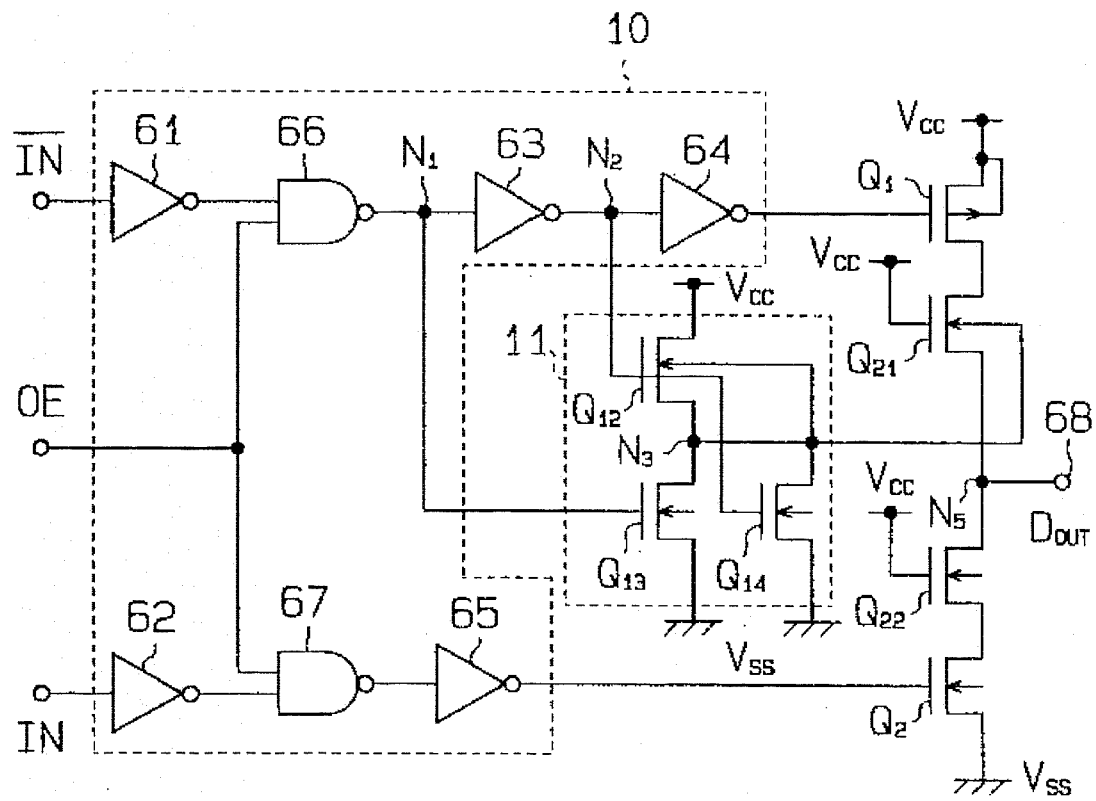
FIG. 5A is a circuit diagram showing an output buffer circuit according to a second embodiment.
Figure 5B:
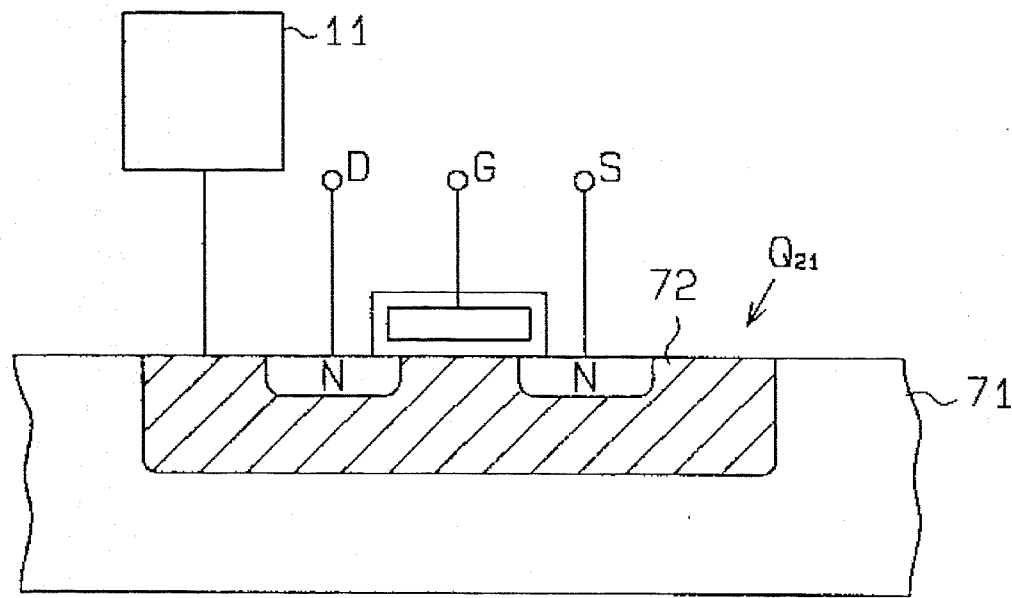
FIG. 5B illustrates a P-type well configuration of an NMOS transistor according to a second embodiment.

As shown in FIG. 5A, the output buffer circuit includes an output controller 10, a well voltage controller 11, and first and second transfer gates $Q_{21}$ and $Q_{22}$, the later two of which are connected in series between transistors $Q_1$ and $Q_2$. The first transfer gate $Q_{21}$, formed from a N-channel MOS transistor, includes a gate connected to the high-potential power supply $V_{cc}$, a drain connected to the drain of the transistor $Q_1$, shown in FIG. 5B, a P-type well region 72 connected to node N3 and a source connected to the drain of the second transfer gate $Q_{22}$. The second transfer gate $Q_{22}$, also formed from a N-channel MOS transistor, has a gate connected to the high-potential power supply $V_{cc}$ and a source connected to the drain of the transistor $Q_2$. A node N5, between the source of the first transfer gate $Q_{21}$ and the drain of the second transfer gate $Q_{22}$, is connected to the output terminal 68. The second transfer gate $Q_{22}$, which is always turned on, has a threshold voltage of about 1 volts.

The operation of the output buffer circuit will now be described. In response to a low output enable signal OE, the output controller 10 outputs a control signal high to the gate of the transistor $Q_1$ and a control signal low to the gate of the transistor $Q_2$. Consequently, transistors $Q_1$ and $Q_2$ turn off, the second transistor $Q_{13}$, in the well voltage controller 11 turns on and the first and third transistors $Q_{12}$ and $Q_{14}$ turn off. This causes the well of the first transfer gate $Q_{21}$ to clamp to the potential of supply voltage $V_{ss}$ and causes the threshold voltage $V_{th}$ of the first transfer gate $Q_{21}$ to increase to roughly 1 volts. When a voltage of 5 volts from an external device (not shown) is applied to the node N5 via the output terminal 68, 5 volts is applied to the source of the first transfer gate $Q_{21}$ and to the drain of the second transfer gate $Q_{22}$. Since the first transfer gate $Q_{21}$ has a threshold voltage of about 1 volts, 4 volts appear at the drains of $Q_{21}$ and $Q_1$, one volt lower than the 5 volts that appears at node 5. Consequently, transistor $Q_1$ remains turned off, preventing current from flowing to the power supply $V_{cc}$, as in the first embodiment. Since the second transfer gate $Q_{22}$, has a threshold voltage of about 1 volts, 4 volts appear at the drain of $Q_2$, and the source of $Q_{22}$. This is obviously one volt lower than the voltage at node 5. This prevents the breakdown of the oxide film at the gate of the transistor $Q_1$, as in the first embodiment.

In the second embodiment, the stability of the high-potential power supply $V_{cc}$ promotes the proper functioning of the semiconductor device despite it being supplied with voltage higher than $V_{cc}$. This stability enhances the compatibility between the output buffer circuit and the semiconductor device Third Embodiment An output buffer circuit according to the third embodiment of the present invention will now be described with reference to FIG. 6A. Circuit components in the third embodiment which correspond or are identical to those in the first or second embodiments will be designated with reference numerals identical to those previously used, and their description will be omitted.

Figure 6A:
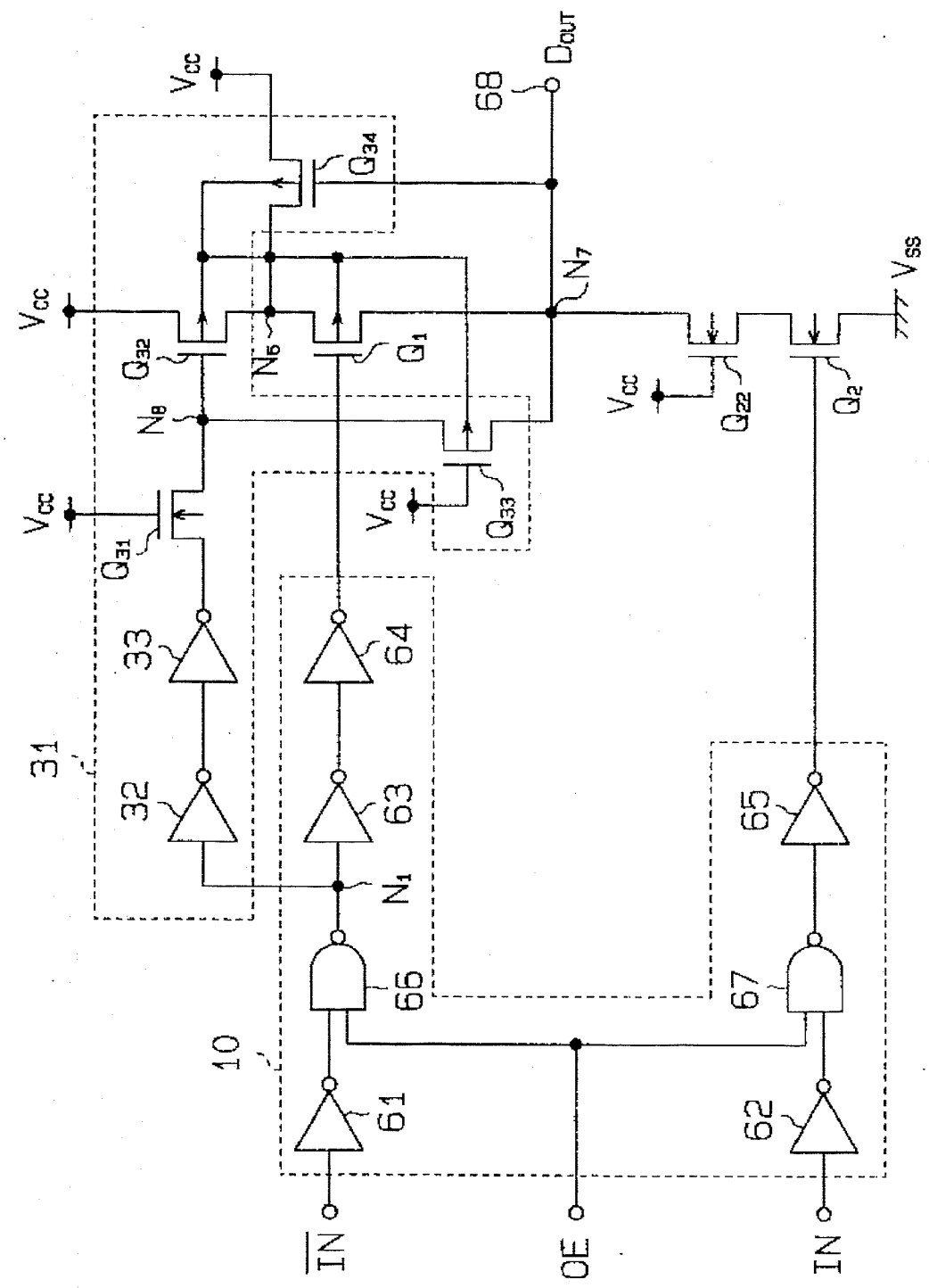
FIG. 6A is a circuit diagram showing an output buffer circuit according to a third embodiment.

As shown in FIG. 6A, the output buffer circuit has the output controller 10, a well voltage controller 31, a PMOS transistor $Q_1$, and NMOS transistors $Q_2$, and $Q_{22}$. The well voltage controller 31 has two inverters 32 and 33, an NMOS transistor $Q_{31}$, and three PMOS transistors $Q_{32}$, $Q_{33}$, and $Q_{34}$. The first PMOS transistor $Q_{32}$ has a source connected to the high-potential power supply $V_{cc}$, a drain connected to the source of the transistor $Q_1$, and a gate. The inverters 32 and 33 and the NMOS transistor $Q_{31}$ are connected in series between the gate of the first PMOS transistor $Q_{32}$ and the node N1. The NMOS transistor $Q_{31}$, has a gate connected to the power supply $V_{cc}$, a threshold voltage of about 1 volts and is always turned on.

The third PMOS transistor $Q_{34}$ is connected between the power supply $V_{cc}$ and a node N6 between the first PMOS transistor and the transistor $Q_1$. A node N7 between the transistors $Q_1$ and $Q_{22}$, couples to an output terminal 68. The second PMOS transistor $Q_{33}$, is provided between nodes N7 and N8 between the transistor $Q_{31}$ and the first PMOS transistor $Q_{32}$. Transistor $Q_{33}$ has a gate connected to the power supply $V_{cc}$, while, shown in FIG. 6B, transistor $Q_1$ and the first to third PMOS transistors $Q_{32}$, $Q_{33}$ and $Q_{34}$ have well regions 74, 76, 78, and 80 coupled to the node N6. These well regions are defined in the surface area of a substrate 82.

The CMOS inverters 32, 33 have a shorter propagation delay time $P_t$ than CMOS inverters 63 and 64. Consequently, in response to the low potential signal at node $N_1$, the first PMOS transistor $Q_{32}$ turns on faster than the transistor $Q_1$. This permits supply voltage $V_{cc}$ to be applied to the source of the transistor $Q_1$ via the first PMOS transistor $Q_{32}$, and allows the transistor $Q_1$ to turn on in response to the low potential signal from inverter 64.

Inverters 61–65, 32 and 33, the NAND gates 66 and 67 and the internal circuit (not shown) are connected to the high-potential power supply $V_{cc}$. Therefore, the semiconductor device, the output buffer circuit 30 and the internal circuit in this embodiment operate on the single supply voltage $V_{cc}$.

The operation of the output buffer circuit according to the third embodiment will now be discussed. When the enable signal OE is output low from the internal circuit, NAND gates 66 and 67 output high potential signals in response to the input signals IN and /IN. The transistor $Q_1$ then turns off in response to the high potential signal output from the inverter 64. Likewise, the first PMOS transistor $Q_{32}$ is turns off in response to the high potential signal output from NMOS transistor $Q_{31}$. Due to the high potential at node N8, the second PMOS transistor $Q_{33}$ turns off. Likewise, the transistor $Q_2$ turns off in response to the low potential signal from the inverter 65. This creates a high impedance state at node N7 and the output terminal 68.

Suppose, for example, that 5 volts from the external device is applied to the output terminal 68. Five volts would consequently be applied to the individual transistors $Q_1$, $Q_{33}$, $Q_{34}$ and $Q_{22}$ via the node N7. The second PMOS transistor $Q_{33}$ opens when the 1.7 volt difference between 5 volt and the 3.3 volt supply voltage $V_{cc}$ (3.3 volts) exceeds the threshold voltage of the transistor $Q_{33}$. Consequently, the potential at the node N8 rises almost to 5 volts. The potential at node N8 would thus be applied to both the transistor $Q_{31}$ and the first PMOS transistor $Q_{32}$.

The transistor $Q_1$ is turned on by the high potential (3.3 volts) applied to its gate and the 5 volts potential at its drain via node N7. Consequently, the potential at the node N6 rises almost to 5 volts. The high potential at the node N6 is applied to the first and third PMOS transistor $Q_{32}$ and $Q_{34}$. The first PMOS transistor $Q_{32}$ stays off due to the potential of about 5 volts applied to the drain and gate of the transistor $Q_{32}$. This inhibits the flow of the current to the power supply $V_{cc}$ from the node N6 via the transistor $Q_{32}$. The third PMOS transistor $Q_{34}$ is turned off by the nearly 5 volt potential at nodes N6 and N7. This inhibits the flow of the current across the transistor $Q_{34}$ to the power supply $V_{cc}$, and in effect, stabilizes the power supply potential $V_{cc}$. Given that the input potential at inverter 33 is about 4 V (approximately five volts at $V_{cc}$, less the one volt threshold voltage drop across transistor $Q_{31}$), the inverter 33 will not fail or break down with 5 volts at its output.

A description will now be given of the operation of the output buffer circuit when the internal circuit output enable signal OE is asserted high. The output controller 10, in response to the input signals IN and /IN, provides high and low potential signals to the transistors $Q_1$ and $Q_2$ turning the transistors either on or off. When the controller receives a low potential signal /IN, the NAND gate 66 outputs a low potential signal that propagates through inverters 32 and 33 and the NMOS transistor $Q_{31}$, turning transistor $Q_{32}$ on. The transistor $Q_1$ then turns on in response to the low potential signal output from the NAND gate 66 that propagates through inverters 63 and 64. Since signal propagation through inverters 32 and 33 is faster than through inverters 63 and 64, transistor $Q_{32}$ switches on prior to transistor $Q_1$, setting node N6 high. Following this, when transistor $Q_1$ turns on, the potential at node N7 goes high. The signal Dout is output from terminal 68 at the voltage potential of node N7. Because the transistor $Q_1$ has a well connected to the node N6, the high potential at node N6 is applied to that well. This lowers the threshold voltage of the transistor $Q_1$. As a result, the transistor $Q_1$ turns on immediately after the first transistor $Q_{32}$ turns on.

Alternatively, should the internal circuit provide a high potential signal /IN to the output controller 10, the NAND gate 66 would in turn provide a high potential signal to node N1. This signal, after propagating through inverters 32, 32 and transistor $Q_{31}$, turns transistor $Q_{32}$ off. Transistor $Q_1$ is turns off in response to the high potential signal provided by inverter 64. Consequently, the potential at node N6 becomes unstable and floats. When, however, a low potential signal IN is provided to the output controller, the transistor $Q_2$ turns on. Considering that the low potential applied to the node N7 due to transistor $Q_{22}$ is always on, and that transistor $Q_{34}$ has the same potential from at its gate, node N6 therefore clamps to the high potential power supply $V_{cc}$ via the third PMOS transistor $Q_{34}$. The prevents the potential at node N6 from floating and the output buffer circuit from malfunctioning.

Although only three embodiments of the present invention have been described herein, it should be apparent to those skilled in the art that the present invention may be embodied in many other specific forms without departing from the spirit or scope of the invention. Particularly, it should be understood that this invention may be embodied in the following forms.

Figure 7:
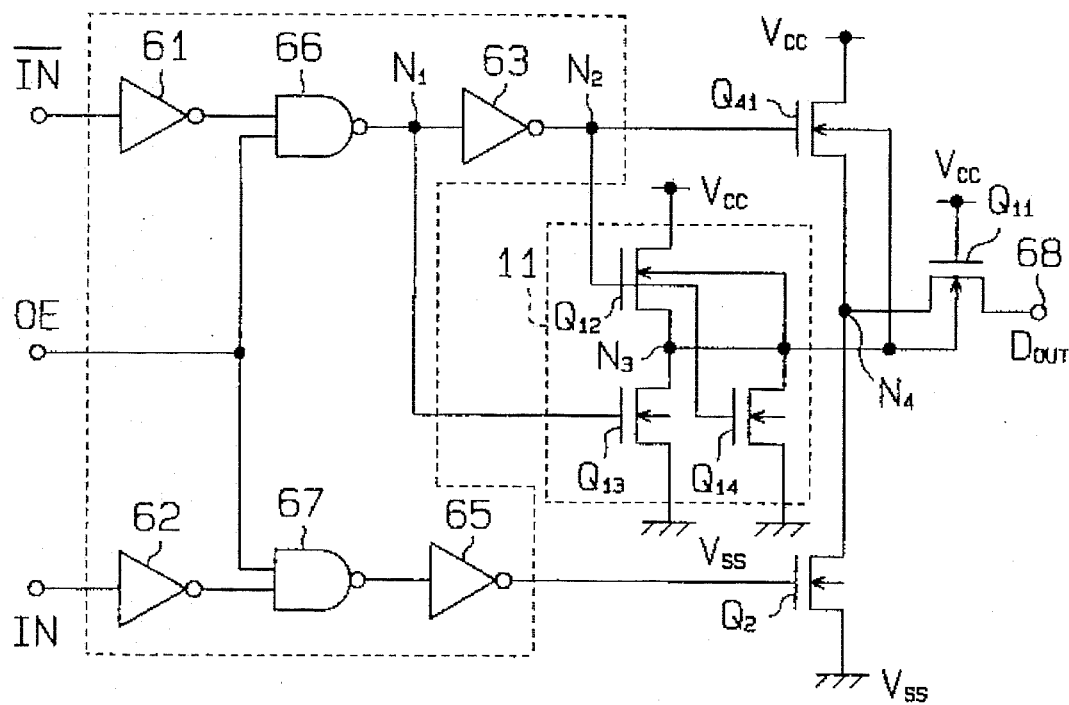
FIG. 7 is a circuit diagram showing an output buffer circuit modified from that described for the first embodiment.
Figure 8:
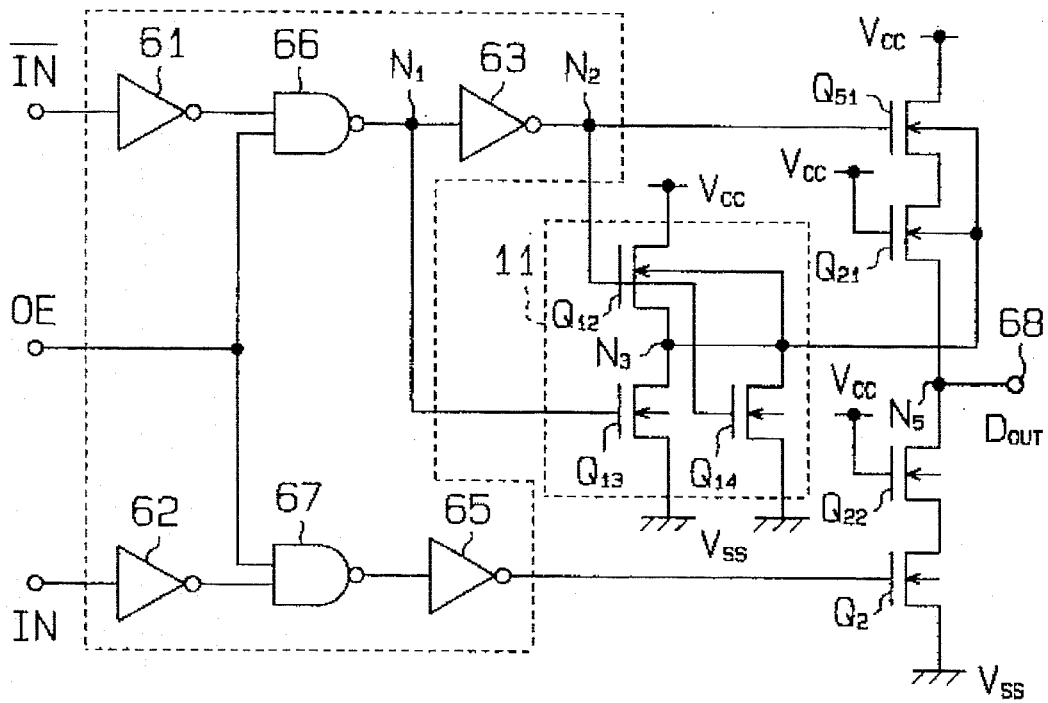
FIG. 8 is a circuit diagram showing an output buffer circuit modified from that described for the second embodiment.

As shown in FIG. 7, the PMOS transistor $Q_1$ in the first embodiment may be replaced with an NMOS transistor $Q_{41}$. This transistor $Q_{41}$ is connected between the power supply $V_{cc}$ and node N4. The transistor $Q_{41}$ has a gate connected to the output terminal of the inverter 63 and a well region connected to the node N3. As shown in FIG. 8, the PMOS transistor $Q_1$ in the second embodiment may be replaced with an NMOS transistor $Q_{51}$. This transistor $Q_{51}$ is connected between the power supply $V_{cc}$ and the transfer gate $Q_{21}$. The transistor $Q_{51}$ has a gate connected to the output terminal of the inverter 63 and a well region connected to node N3. The use of the transistor $Q_{41}$ or $Q_{31}$ eliminates the need for the inverter 64 and permits the output controller to perform the ON/OFF switching of the transistor $Q_{41}$ ($Q_{51}$) and the transistor $Q_2$ at the same time.

The output buffer circuit of each of the above-described embodiments may be incorporated in an IC used in a semiconductor memory device like an SRAM or DRAM, and a microcomputer system. Each of the output buffer circuits may be used as an input/output buffer circuit with an input coupled to the output terminal 68.

Therefore, the present examples and embodiments are to be considered as illustrative and not restrictive and the invention is not to be limited to the details given herein, but may be modified within the scope of the appended claims.

What is claimed is:

1. An output buffer circuit for a semiconductor device for buffering the output of data signals from said semiconductor, said buffer circuit operating in response to an enable signal and a data signal, said buffer circuit comprising:

a first and a second transistor connected in series between a first and a second potential, a third transistor having a well region formed on a substrate and having a first terminal between said first and second transistors, and having a second terminal serving as an output terminal of said output buffer circuit;

a voltage controller coupled to said third transistor for controlling the voltage applied to the well region of said third transistor; and an output controller, coupled to said first and second transistors and responsive to said enable signal and said data signal, for generating a pair of switching control signals to control the switching of said first and second transistors, and for generating at least one voltage control signal to control said voltage controller, such that the voltage applied to well region of said third transistor controls the flow of current across said first and second terminals.

2. The output buffer circuit according to claim 1, wherein said first transistor is a P-channel MOS transistor and said second transistor is an N-channel MOS transistor.

3. The output buffer circuit according to claim 1, wherein each of said first and second transistors is an N-channel MOS transistor.

4. The output buffer circuit according to claim 1, wherein said third transistor is an N-channel MOS transistor having a gate coupled to said first potential.

5. The output buffer circuit according to claim 1, further comprising a fourth N-channel MOS transistor coupled in series with the third N-channel MOS transistor, between said first and second transistors, wherein said third transistor having a gate coupled to said first potential, and a well region coupled to said voltage controller, and said fourth transistor having a gate coupled to said first potential.

6. The output buffer circuit according to claim 1, wherein said voltage controller further includes a first and a second transistor connected in series between said first and second potential, at a second node between said first and second transistor coupled to the well region of said third transistor, wherein said series connected first and second transistors of said voltage controller being responsive to the voltage control signal from said output controller in order to control the voltage applied to the well region of said third transistor.

7. The output buffer circuit according to claim 6, wherein said first and second transistors are N-channel MOS transistors.

8. The output buffer circuit according to claim 6, wherein said voltage controller further includes a third transistor connected between said second node and said second potential.

9. The output buffer circuit according to claim 8, wherein each of said first to third transistors is an N-channel MOS transistor.

10. The output buffer circuit according to claim 1, wherein said first potential is a high potential and said second potential is a low potential.

11. The output buffer circuit for a semiconductor device for buffering the output of data signals from said semiconductor, said buffer circuit operating in response to an enable signal and a data signal, said buffer circuit comprising:

a first and a second transistor connected in series between a first and a second potential;

an output controller, coupled to said first and second transistors and responsive to said enable and data signals for generating a first and a second switching control signal that control the respective switching of said first and second transistors, and for generating a third switching control signal; and a voltage controller having a third transistor coupled between the first transistor and said first potential, and being responsive to said third control switching signal to prevent the flow of current from said first transistor to said first potential when the voltage potential between said first and second transistors is greater than said first potential.

12. The output buffer circuit according to claim 11, wherein the first transistor is a P-channel MOS transistor, the second transistor is an N-channel MOS transistor, and the third transistor is a P-channel MOS transistor having a gate that receives said third switching control signal, wherein the voltage controller includes a plurality of inverters that delay the propagation of said third switching control signal to said third transistor, and wherein the output controller includes a plurality of inverters that delay the propagation of said first switching control signal to said first transistor for a longer period of time than the delay of said third switching control signal, said voltage controller further including:

a fourth P-channel MOS transistor coupled to the gate of said third transistor and to a first node between said first and second transistors; and a fifth P-channel MOS transistor connected between said first potential and a second node between said first and third transistors, wherein said fifth transistor having a gate coupled to said first node.

13. The output buffer circuit according to claim 12, wherein each of said first, third, fourth and fifth P-channel MOS transistors have a well region defined on a substrate coupled to said second node.

14. The output buffer circuit according to claim 12, further including a sixth N-channel MOS transistor, coupled between the second transistor and the first node, wherein said sixth transistor having a gate coupled to said first potential.

15. The output buffer circuit according to claim 11, wherein said first potential is a high potential and said second potential is a low potential.

* * * * *